(12) United States Patent
Chen et al.

(10) Patent No.: US 8,319,311 B2
(45) Date of Patent: Nov. 27, 2012

(54) HYBRID STI GAP-FILLING APPROACH

(75) Inventors: Neng-Kuo Chen, Tainan (TW);
Cheng-Yuan Tsai, Chu-Pei (TW);
Kuo-Hwa Tzeng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 382 days.

(21) Appl. No.: 12/688,939

(22) Filed: Jan. 18, 2010

(65) Prior Publication Data

US 2010/0230757 A1  Sep. 16, 2010

Related U.S. Application Data

(60) Provisional application No. 61/160,635, filed on Mar. 16, 2009.

(51) Int. Cl.
*H01L 29/78* (2006.01)

(52) U.S. Cl. ......... 257/510; 257/E21.546; 257/E29.255; 438/435

(58) Field of Classification Search .................. 257/519, 257/E21.546; 438/435
See application file for complete search history.

(56) References Cited

U.S. PATENT DOCUMENTS

| | | | |
|---|---|---|---|
| 6,159,801 A | 12/2000 | Hsieh et al. | |
| 6,706,571 B1 | 3/2004 | Yu et al. | |
| 6,858,478 B2 | 2/2005 | Chau et al. | |
| 6,867,086 B1 | 3/2005 | Chen et al. | |
| 7,033,945 B2 | 4/2006 | Byun et al. | |
| 7,190,050 B2 | 3/2007 | King et al. | |
| 7,247,887 B2 | 7/2007 | King et al. | |
| 7,265,008 B2 | 9/2007 | King et al. | |
| 7,358,142 B2 | 4/2008 | Kang et al. | |
| 7,358,145 B2 | 4/2008 | Yang | |
| 7,508,031 B2 | 3/2009 | Liu et al. | |
| 7,528,465 B2 | 5/2009 | King et al. | |
| 7,535,061 B2 * | 5/2009 | Lee et al. | 257/347 |
| 7,588,985 B2 * | 9/2009 | Kim | 438/270 |
| 7,605,449 B2 | 10/2009 | Liu et al. | |
| 7,674,685 B2 * | 3/2010 | Choi et al. | 438/427 |
| 7,843,000 B2 | 11/2010 | Yu et al. | |
| 2002/0072198 A1 | 6/2002 | Ahn | |
| 2003/0013271 A1 | 1/2003 | Knorr et al. | |
| 2003/0143852 A1 | 7/2003 | En-Ho et al. | |
| 2004/0144749 A1 | 7/2004 | Kim et al. | |
| 2005/0153490 A1 | 7/2005 | Yoon et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2008/0217702 A1 * | 9/2008 | Oishi | 257/397 |
| 2008/0290470 A1 | 11/2008 | King et al. | |
| 2008/0296632 A1 | 12/2008 | Moroz et al. | |
| 2009/0127648 A1 | 5/2009 | Chen et al. | |

(Continued)

*Primary Examiner* — Trung Q Dang
(74) *Attorney, Agent, or Firm* — Slater & Matsil, L.L.P.

(57) ABSTRACT

A method of forming an integrated circuit structure includes providing a semiconductor substrate including a top surface; forming an opening extending from the top surface into the semiconductor substrate; and performing a first deposition step to fill a first dielectric material into the opening. The first dielectric material is then recessed. A second deposition step is performed to fill a remaining portion of the opening with a second dielectric material. The second dielectric material is denser than the first dielectric material. The second dielectric material is recessed until a top surface of the second dielectric material is lower than the top surface of the semiconductor substrate.

32 Claims, 10 Drawing Sheets

U.S. PATENT DOCUMENTS

| | | | |
|---|---|---|---|
| 2009/0170321 A1* | 7/2009 | Cho et al. | 438/692 |
| 2009/0181477 A1 | 7/2009 | King et al. | |
| 2010/0078757 A1* | 4/2010 | Eun | 257/506 |
| 2010/0099236 A1 | 4/2010 | Kwon et al. | |
| 2010/0190345 A1 | 7/2010 | Chen et al. | |

* cited by examiner

HYBRID STI GAP-FILLING APPROACH

This application claims the benefit of U.S. Provisional Application No. 61/160,635 filed on Mar. 16, 2009, entitled "Hybrid STI Gap-Filling Approach," which application is hereby incorporated herein by reference.

TECHNICAL FIELD

This invention relates generally to integrated circuits and more particularly to structures and manufacturing methods of shallow trench isolation (STI) regions and semiconductor fins.

BACKGROUND

Modern integrated circuits are formed on the surfaces of semiconductor substrates, which are mostly silicon substrates. Semiconductor devices are isolated from each other by isolation structures formed at the surfaces of the respective semiconductor substrates. The isolation structures include field oxides and shallow trench isolation (STI) regions.

With the down-scaling of integrated circuits, STI regions are increasingly used as the isolation structures. FIGS. 1 and 2 illustrate intermediate stages in the formation of an STI region. First, as shown in FIG. 1, opening 112 is formed in substrate 110, for example, by etching. Opening 112 has an aspect ratio, which is equal to the ratio of depth D1 to width W1. The aspect ratio becomes increasingly greater when the integrated circuits are scaled down. For 40 nm technology and below, the aspect ratio will be greater, and sometimes far greater, than 7.0. Liner oxide 114 is formed in opening 112. Next, as shown in FIG. 2, oxide 116, preferably a silicon oxide, is filled into opening 112, until the top surface of oxide 116 is higher than the top surface of substrate 110.

The increase in the aspect ratio causes problems. Referring to FIG. 2, in the filling of the opening, the high aspect ratio will adversely result in the formation of void 117, which is a result of the pre-mature sealing in the top region of oxide 116. After a chemical mechanical polish (CMP) to remove excess oxide 116, or after the subsequent cleaning process that lowers the top surface of oxide 116, void 117 may be exposed. In subsequent process steps, conductive materials, such as polysilicon, may be filled into the opening, causing the bridging, and even the shorting, of integrated circuits in some circumstances.

Conventionally, oxide 116 is often filled using one of the two methods, high-density plasma chemical vapor deposition (HDPCVD, also known as HDP) and high aspect-ratio process (HARP). The HDP may fill gaps with aspect ratios less than about 6.0 without causing voids. The HARP may fill gaps with aspect ratios less than about 7.0 without causing voids. However, as the aspect ratios are close to 7.0, even if no voids are formed, the central portion of oxides 116 formed using the HARP is often weak. The weak portions may be damaged by the CMP processes, which in turn cause voids as a result of the CMP. When the aspect ratios further increase to greater than about 7.0, voids start to appear even if the HARP is used. Accordingly, the existing gap-filling techniques can only fill gaps having aspect ratios less than 7.0 without causing voids.

In addition to the above-discussed problem, the conventional gap-filling methods also incur problems in the formation of fin field-effect transistors (FinFETs). For example, FIGS. 3 and 4 illustrate a process for forming semiconductor fins that are used for forming FinFETs. In FIG. 3, after STI regions 120, which include liner oxide 114 and oxide 116, are formed, pad layers and hard masks (not shown) are removed. Next, as shown in FIG. 4, STI regions 120 are recessed so that fins 118 stand above the remaining portions of STI regions 120. However, since STI regions 120 include liner oxide 114 and oxide 116, with liner oxide 114 being denser than oxide 116, in the recessing of STI regions 120, the loose structure of oxide 116 results in rapid downward etching, and hence fences 122 (the residue of STI regions 120) are formed on sidewalls of fins 118. In the subsequent formation of gate dielectrics of the FinFETs (not shown), fences 122 result in the reduction of the amount of oxygen reaching fins 118, and hence the thickness of the resulting gate dielectrics, particularly in regions close to the top surface of the remaining portions of STI regions 120. Further, fences 122 may act as parts of gate dielectrics of the FinFETs. Due to the low quality of fences 122, leakage currents of the resulting FinFETs increase. Experiments have revealed that when the flash memory cells, based on the structure as shown in FIG. 4, are subject to 10,000 writing cycles, the threshold voltages significantly increase, indicating significant leakage currents.

SUMMARY OF THE INVENTION

In accordance with one aspect of the present invention, a method of forming an integrated circuit structure includes providing a semiconductor substrate having a top surface; forming an opening extending from the top surface into the semiconductor substrate; and performing a first deposition step to fill a first dielectric material into the opening. The first dielectric material is then recessed. A second deposition step is performed to fill a remaining portion of the opening with a second dielectric material. The second dielectric material is denser than the first dielectric material. The second dielectric material is recessed until a top surface of the second dielectric material is lower than the top surface of the semiconductor substrate.

In accordance with another aspect of the present invention, a method of forming an integrated circuit structure includes providing a semiconductor substrate having a top surface; forming an opening extending from the top surface into the semiconductor substrate; and performing a first deposition step using a first deposition method to fill a first dielectric material into the opening. The first dielectric material is recessed to form a first recess in the opening and having a first depth. A second deposition step is performed to fill the opening with a second dielectric material. The second deposition step is performed using a second deposition method different from the first deposition method. The second dielectric material is recessed to form a second recess in the opening, wherein the second recess has a second depth smaller than the first depth.

In accordance with yet another aspect of the present invention, a method of forming an integrated circuit structure includes providing a semiconductor substrate having a top surface; forming an opening extending from the top surface into the semiconductor substrate; and performing a first deposition step to fill a first dielectric material into the opening. The first dielectric material is recessed to form a first recess. A second deposition step is performed to fill the first recess with a second dielectric material using high-density plasma (HDP). An annealing is performed to the second dielectric material. The second dielectric material is then planarized, followed by recessing the second dielectric material.

In accordance with yet another aspect of the present invention, an integrated circuit structure includes a semiconductor substrate having a top surface; an opening extending from the top surface into the semiconductor substrate; a first dielectric material filling a lower portion of the opening, wherein the first dielectric material has a first etching rate; and a second dielectric material filling an upper portion of the opening. The second dielectric material has a second etching rate lower than the first etching rate.

In accordance with yet another aspect of the present invention, an integrated circuit structure includes a semiconductor substrate having a top surface; an opening extending from the top surface into the semiconductor substrate; a liner oxide lining the opening; and a first dielectric material filling a lower portion of the opening and spaced apart from the semiconductor substrate by the liner oxide. The first dielectric material has a first density. The integrated circuit structure includes a second dielectric material filling an upper portion of the opening. The second dielectric material has a second density greater than the first density and contacting the semiconductor substrate.

The advantageous features of the present invention include semiconductor fins substantially free from fences. In addition, the formation of STI regions with aspect ratios greater than about 11.0 may be incorporated into the formation of the semiconductor fins.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention and do not limit the scope of the invention.

A novel method for forming a shallow trench isolation (STI) region and a fin field-effect transistor (FinFET) is provided. The intermediate stages in the manufacturing of an embodiment are illustrated. The variations of the embodiment are discussed. Throughout the various views and illustrative embodiments of the present invention, like reference numbers are used to designate like elements.

Figure 1:
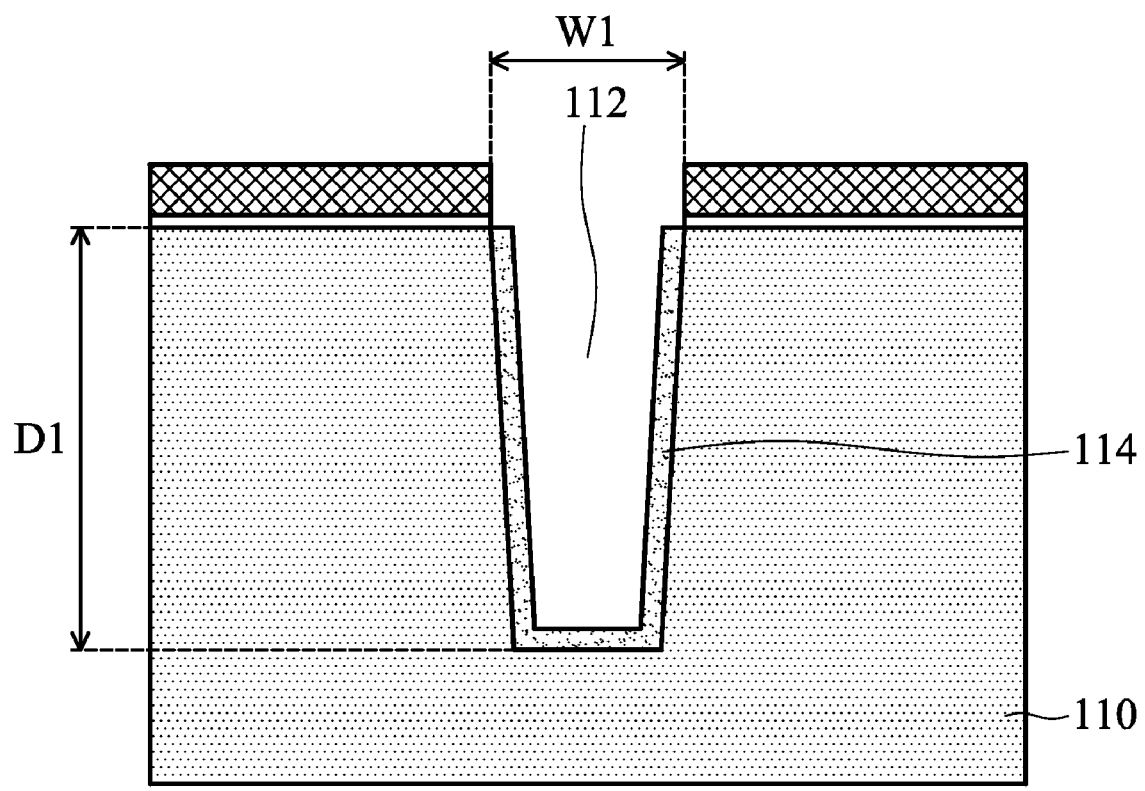
FIGS. 1 and 2 illustrate a conventional process for forming shallow trench isolation (STI) regions.
Figure 2:
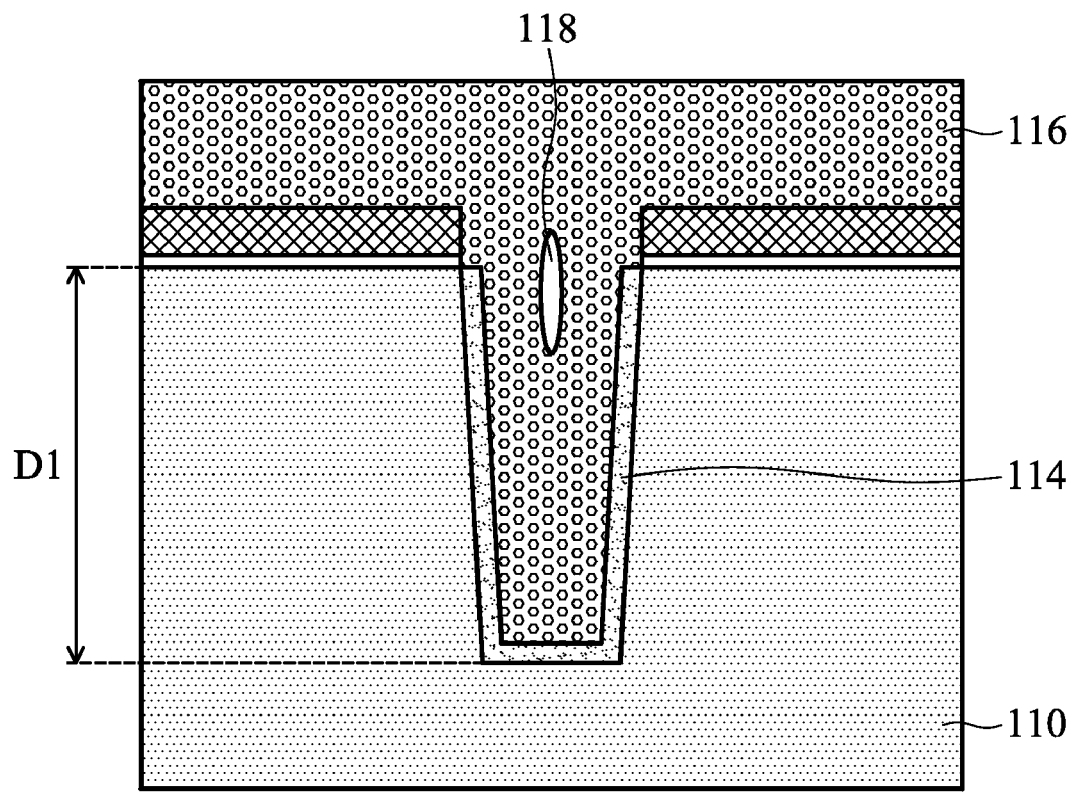
Figure 3:
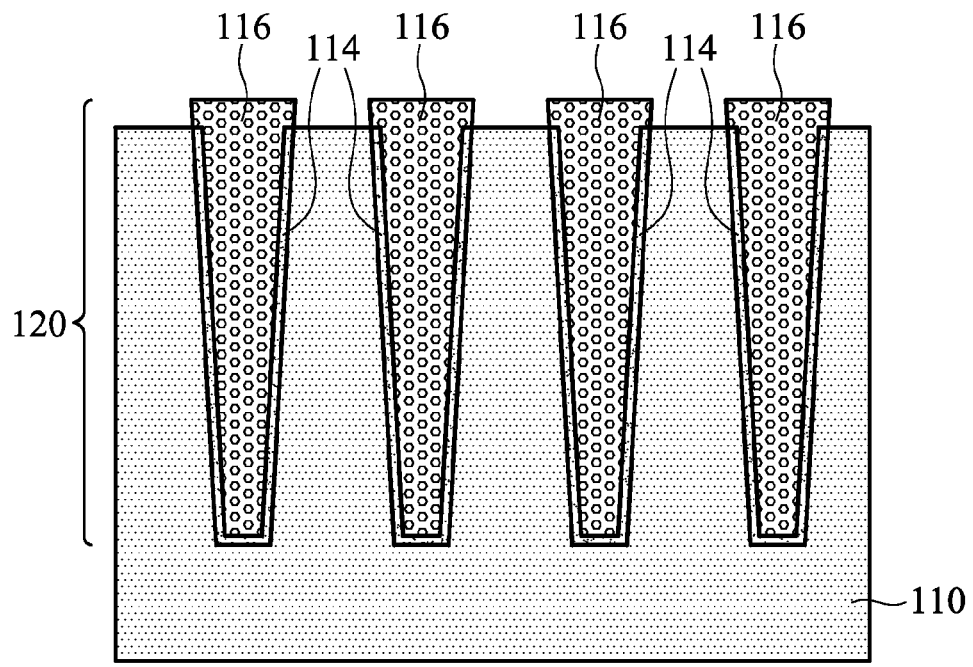
FIGS. 3 and 4 illustrate a conventional process for forming semiconductor fins by recessing STI regions.
Figure 4:
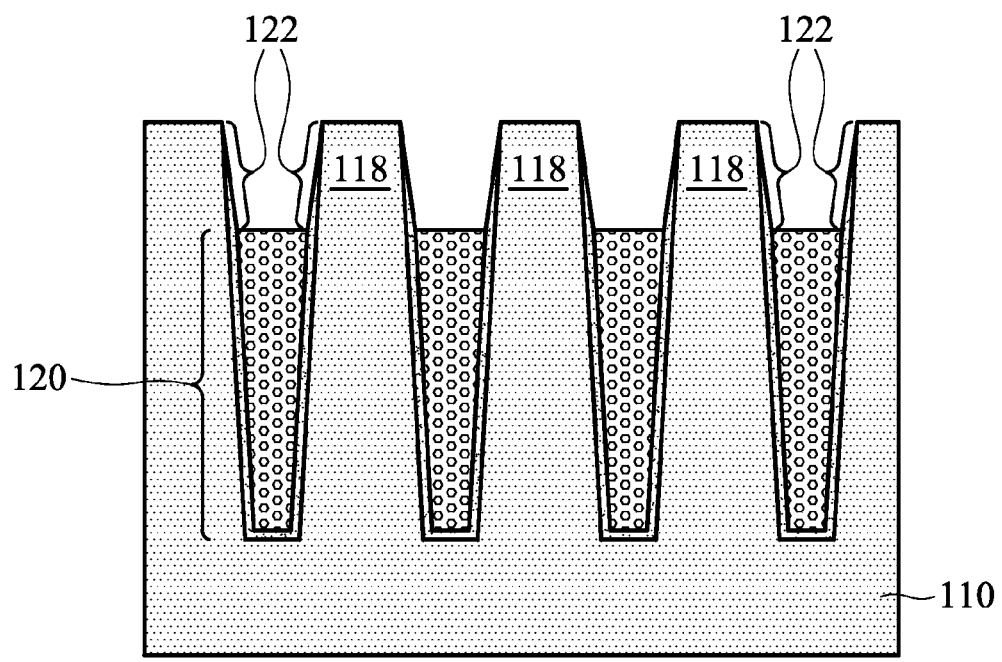
Figure 5:
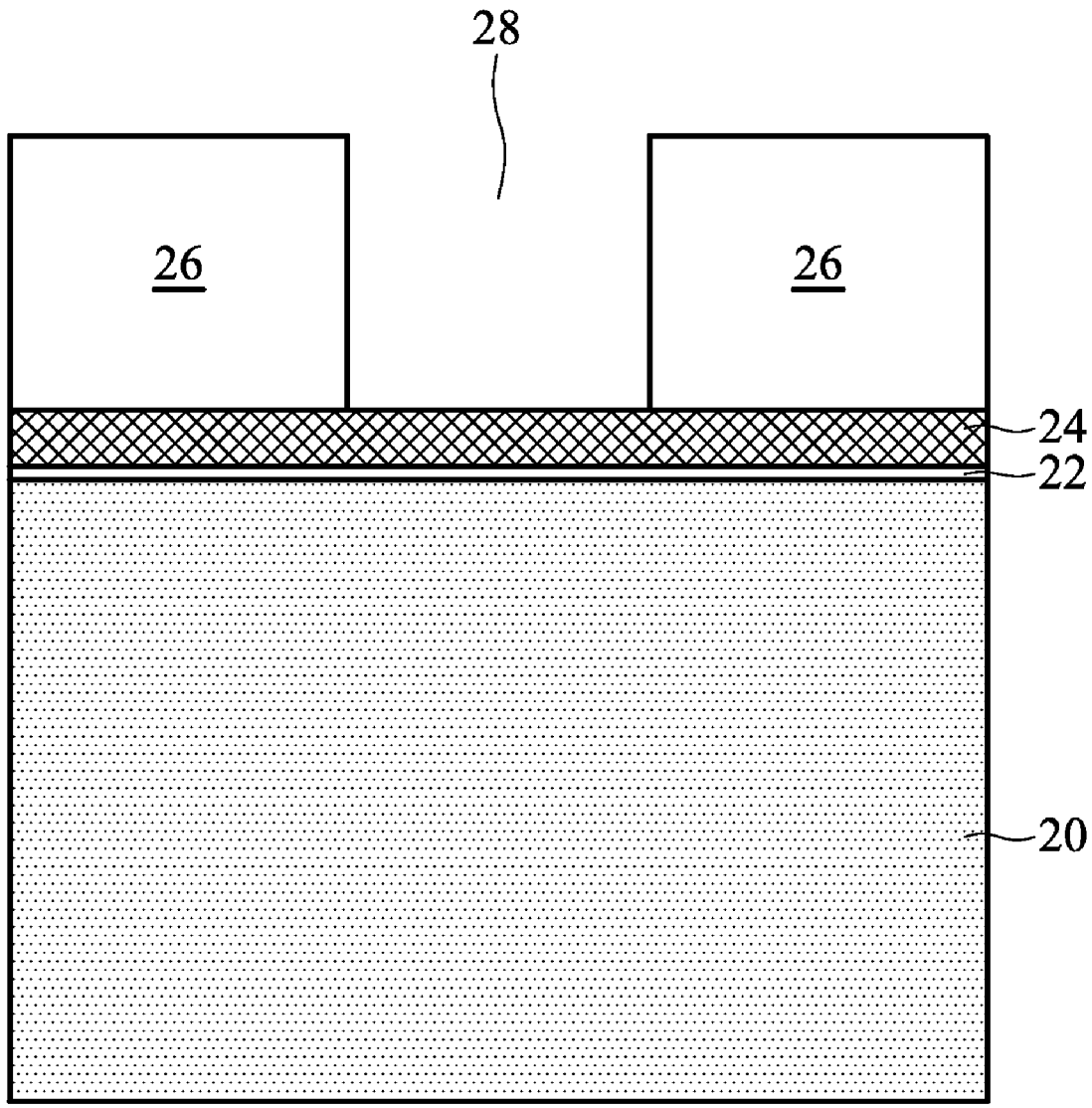
FIGS. 5 through 14 are cross-sectional views of intermediate stages in the manufacturing of an embodiment.

Referring to FIG. 5, semiconductor substrate 20 is provided. In an embodiment, semiconductor substrate 20 includes silicon. Other commonly used materials, such as carbon, germanium, gallium, arsenic, nitrogen, indium, and/or phosphorus, and the like, may also be included in semiconductor substrate 20. Semiconductor substrate 20 may be formed of a single-crystalline material or a compound material, and may be a bulk substrate or a semiconductor-on-insulator (SOI) substrate.

Pad layer 22 and mask layer 24 are formed on semiconductor substrate 20. Pad layer 22 may be a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In an embodiment, mask layer 24 is formed of silicon nitride, for example, using low-pressure chemical vapor deposition (LPCVD). In other embodiments, mask layer 24 is formed by thermal nitridation of silicon, plasma enhanced chemical vapor deposition (PECVD), or plasma anodic nitridation. Mask layer 24 is used as a hard mask during subsequent photolithography processes. Photoresist 26 is formed on mask layer 24 and is then patterned, forming opening 28 in photoresist 26.

Figure 6:
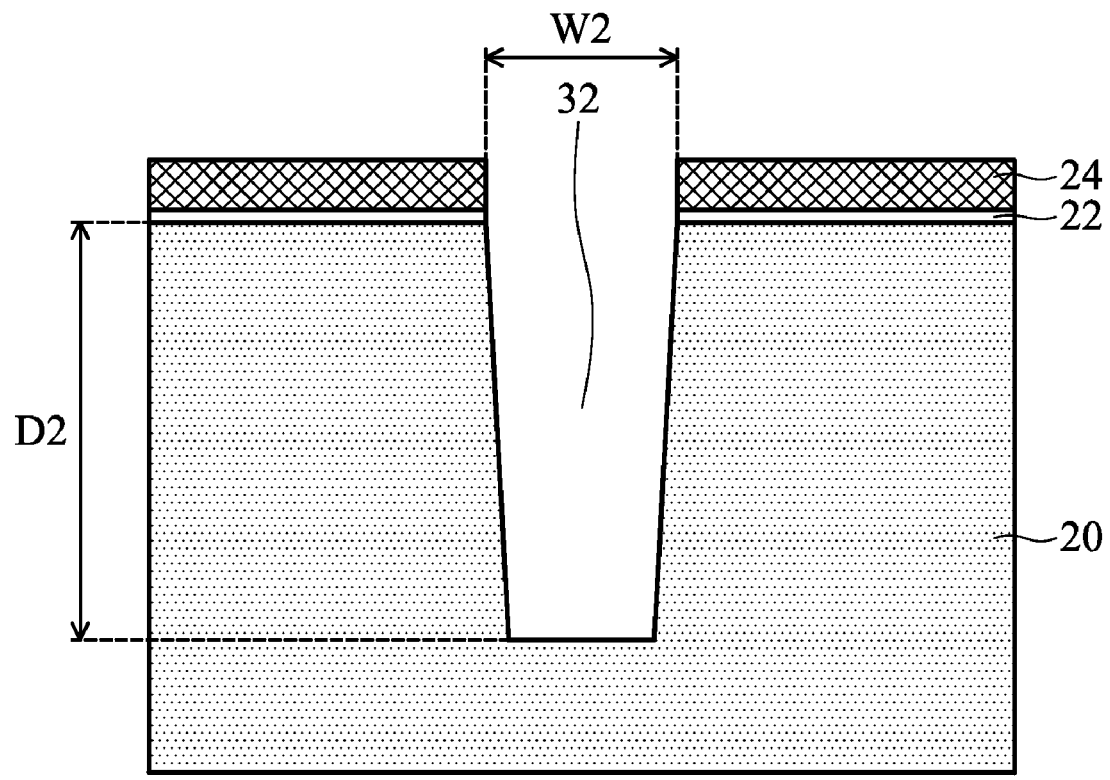

Referring to FIG. 6, mask layer 24 and pad layer 22 are etched through opening 28, exposing underlying semiconductor substrate 20. The exposed semiconductor substrate 20 is then etched, forming trench 32. Photoresist 26 is then removed. Next, a cleaning may be performed to remove a native oxide of semiconductor substrate 20. The cleaning may be performed using diluted hydrofluoric (HF) acid. Depth D2 of trench 32 may be between about 2100 Å and about 2500 Å, while width W2 is between about 420 Å and about 480 Å. In an exemplary embodiment, the aspect ratio (D2/W2) of opening 32 is greater than about 7.0. In other exemplary embodiments, the aspect ratios may even be greater than about 11.0, although they may also be lower than about 7.0, or between 7.0 and 11.0. One skilled in the art will realize, however, that the dimensions and values recited throughout the descriptions are merely examples, and may be changed to suit different scales of integrated circuits.

Figure 7:
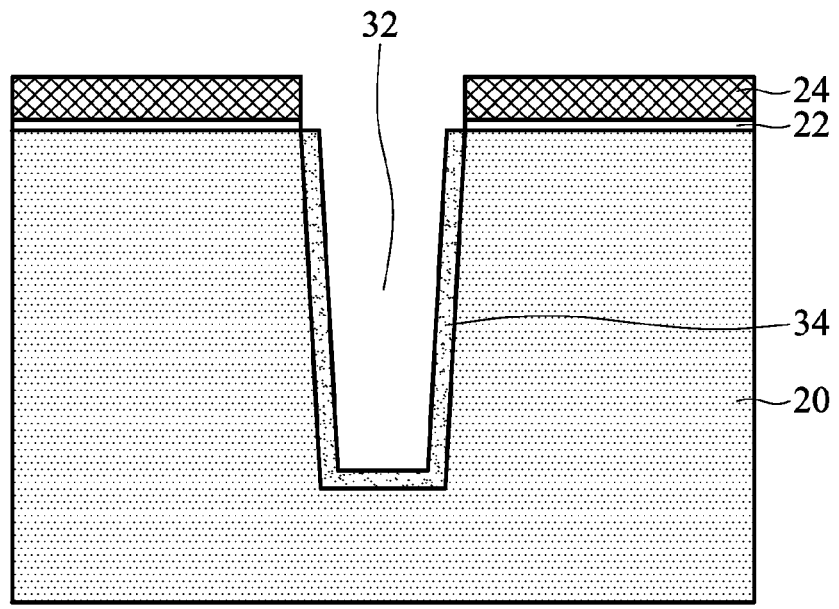

Liner oxide 34 is then formed in trench 32, as is shown in FIG. 7. In an embodiment, liner oxide 34 may be a thermal oxide having a thickness between about 20 Å to about 500 Å. In other embodiments, liner oxide 34 may be formed using in-situ steam generation (ISSG). In yet other embodiments, liner oxide 34 may be formed using a deposition technique that can form conformal oxide layers, such as selective area chemical vapor deposition (SACVD) and the like. The formation of liner oxide 34 rounds the corners of trench 32, which reduces the electrical fields, and hence improves the performance of the resulting integrated circuit.

Figure 8:
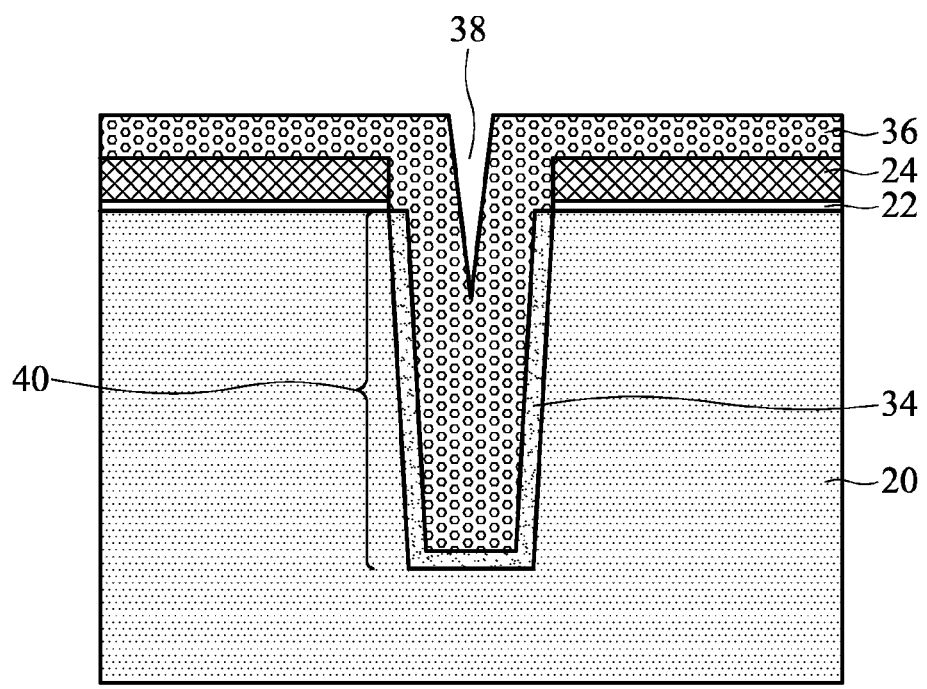

Referring to FIG. 8, trench 32 is filled with dielectric material 36. Dielectric material 36 may include silicon oxide, and hence is referred to as oxide 36, although other dielectric materials, such as SiN, SiC, or the like, may also be used. In an embodiment, oxide 36 is formed using a HARP, which may be an enhanced HARP (EHARP). In alternative embodiments, oxide 36 is formed using other methods having good gap-filling ability, such as spin-on. It is realized that when the aspect ratio of trench 32 is greater than about 7.0, void 38, which may be fully or partially embedded in oxide 36, may be formed. If necessary, a chemical mechanical polish (CMP) may be performed to remove excess oxide 36. The portion of oxide 36 in trench 32 is referred to as shallow trench isolation (STI) region 40 hereinafter.

Figure 9A:
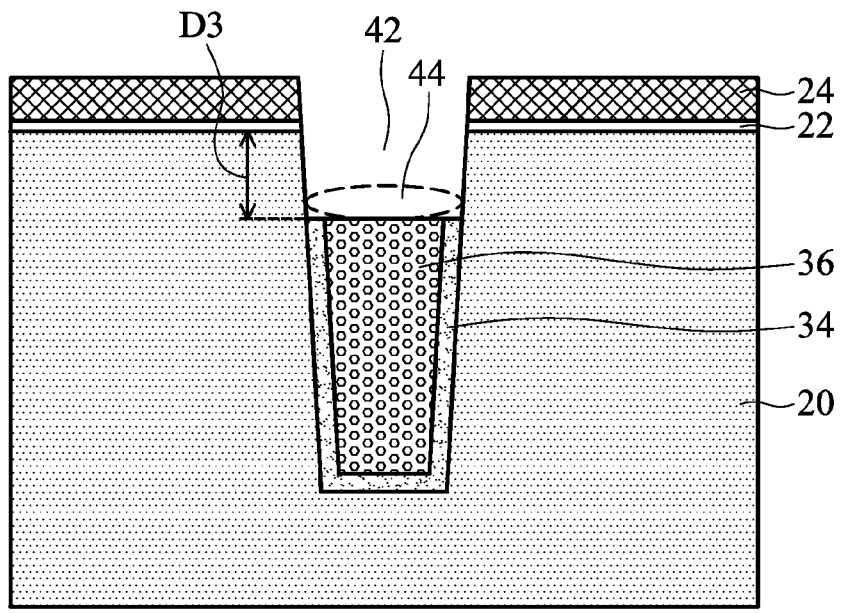
Figure 9B:
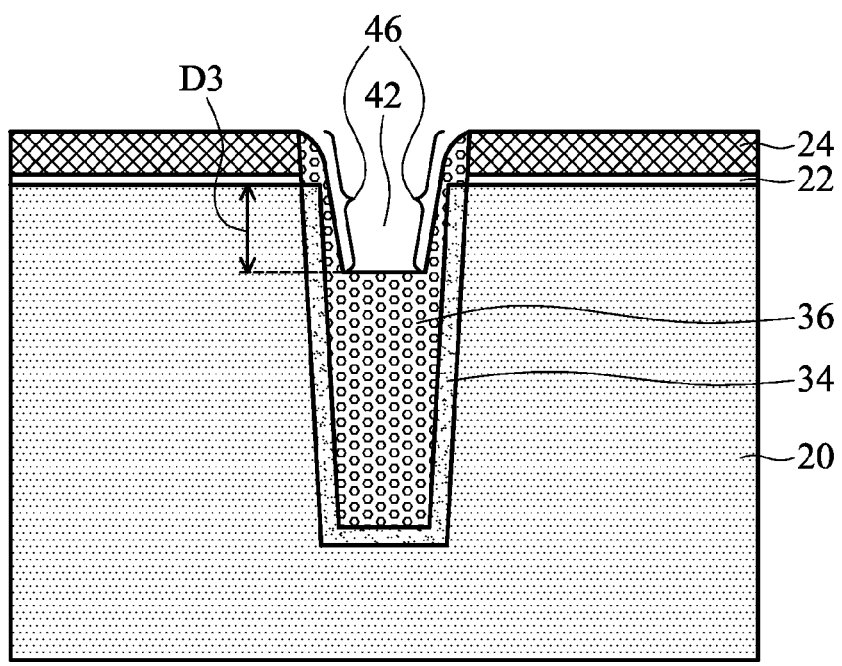

Next, as shown in FIG. 9A, oxide 36 is partially etched by an etching step, resulting in recess 42. In an exemplary embodiment, depth D3 of recess 42 may be between about 10 nm and about 100 nm. The aspect ratio D3/H2 of recess 42 may be between about 0.5 and about 10. In an embodiment, the etching is a dry etching performed using Siconi (also referred to as SiCoNi), in which the process gases include $NH_3$ and $NF_3$. During the etching, a low energy is provided to generate plasma. In alternative embodiments, other polymer-rich gases may be used as process gases (etchant), which may include $CHF_3$, $CH_2F_2$, $CH_3F$, $C_4F_6$, $C_4F_8$, $C_5F_8$, and combinations thereof. By using Siconi gases or the polymer-rich gases during the etching process, polymer (schematically illustrated as 44) is generated and deposited to the bottom of recess 42, and hence the top surface of the remaining STI region 40 is protected. Accordingly, the downward etching is reduced. On the other hand, the sidewalls of oxide 36, if any, are not protected by polymer 44. The resulting effect is the enhanced lateral etching, so that there will be no fences (which are residue oxide 36 and residue liner oxide 34) left to expose to the sides of recess 42. If, however, there are any fences left, the resulting structure is shown in FIG. 9B.

In alternative embodiments, the recessing of oxide 36 includes a wet dip, for example, in a diluted hydrofluoric (HF) acid solution. Since oxide 36 may have a low density, it is difficult to control the wet dip process to stop accurately at a desirable level. Therefore, before the wet dip, as shown in FIG. 9A or 9B, is performed, and after the structure as shown in FIG. 8 is formed, a nitrogen ($N_2$) dry anneal may be performed. In an embodiment, the nitrogen dry anneal is performed at a temperature between about 500° C. and about 1300° C., with a duration between about 0.5 hours and about 15 hours. The nitrogen dry anneal has the function of densifying oxide 36, so that the wet dip is slower and easier to control. It is appreciated that since liner oxide 34 may be denser than oxide 36, the etching rate of liner oxide 34 may be lower than the etching rate of oxide 36, and hence fences 46 may be generated. Please note that due to the formation of recess 42, void 38, as shown in FIG. 8, may be removed.

Figure 10:
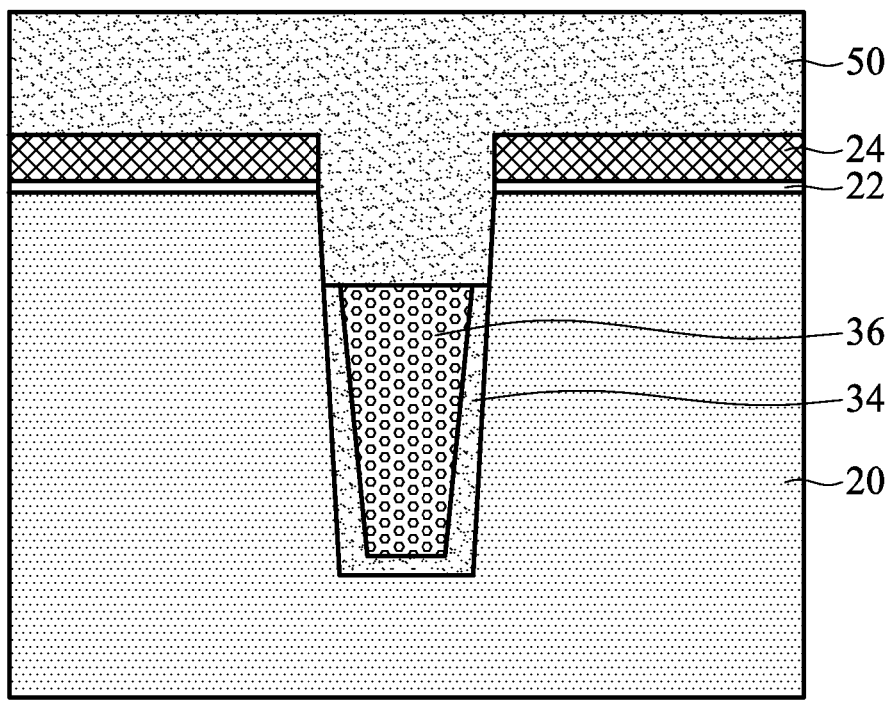

Referring to FIG. 10, recess 42 is filled with dielectric 50, until the top surface of dielectric 50 is higher than the top surface of mask layer 24. Dielectric 50 is referred to as oxide 50 hereinafter, even though it may be formed of other materials other than oxides, such as SiON, SiN, or the like. Oxide 50 may have a density greater than the density of oxide 36 (refer to FIG. 8), for example, by greater than between about 10 percent to about 300 percent. Accordingly, oxide 50 may be formed using a method suitable for forming high-quality (dense) oxides. In an embodiment, the formation methods include high-density plasma chemical vapor deposition (HD-PCVD, also known as high-density plasma, or HDP).

Figure 11:
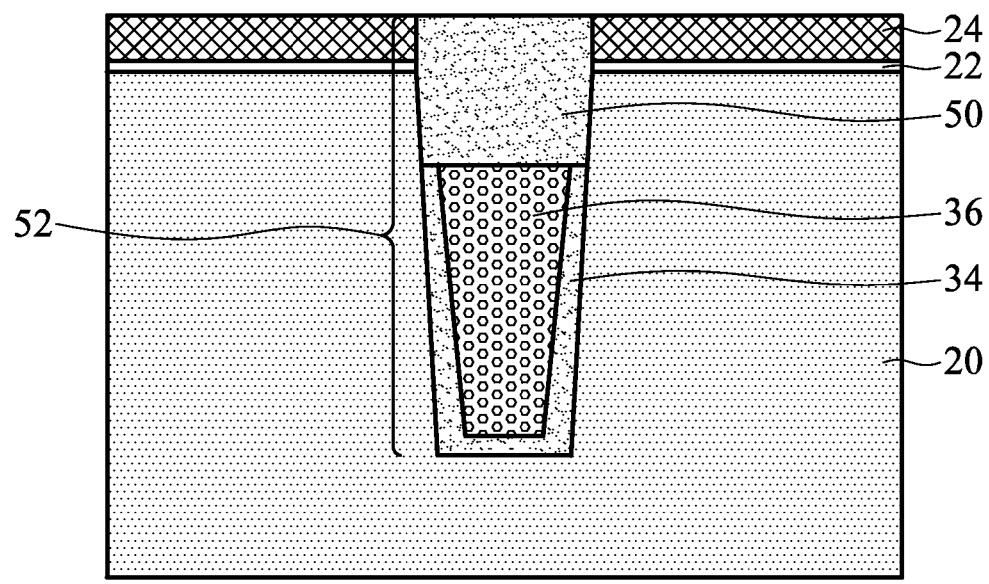

An anneal is then performed to further densify oxide 50. In an embodiment, the anneal is performed at a temperature between about 500° C. and about 1300° C. The duration may be between about 0.5 hours and about 15 hours. A planarization, for example, a chemical mechanical polish (CMP)) is then performed to remove excess oxide 50, resulting in a structure as shown in FIG. 11. Mask layer 24 may act as a CMP stop layer if the CMP is performed. The remaining portions of oxides 36 and 50 form STI region 52.

Figure 12:
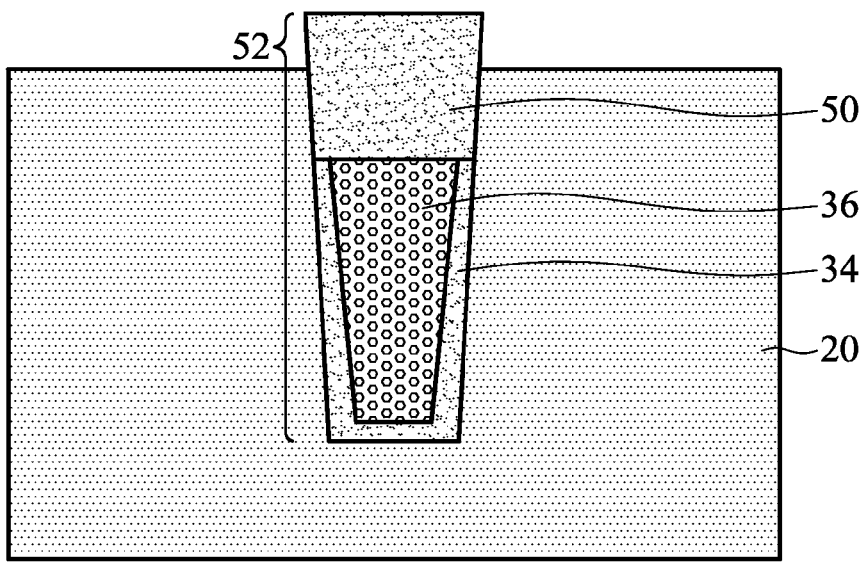

Mask layer 24 and pad layer 22 are then removed, as shown in FIG. 12. Mask layer 24, if formed of silicon nitride, may be removed by a wet process using hot $H_3PO_4$, while pad layer 22 may be removed using diluted HF acid, if formed of silicon oxide. Next, in FIG. 13, STI region 52 is recessed, forming recess 54 in semiconductor substrate 20. In an embodiment, a bottom of recess 54 is higher than an interface between oxide 36 and oxide 50, and hence a layer of oxide 50 remains. Accordingly, depth D4 of recess 54 is smaller than depth D3 as shown in FIG. 9A. In the resulting structure, top surface 56 of oxide 50 is flat, or substantially flat. Depth D4 may be greater than about 30 nm, and may also be between about 5 nm and about 100 nm, although it may be greater or smaller. Since oxide 50 is denser than oxide 36, and may have a density close to the density of liner oxide 34, after the formation of recess 54 there will be no fences formed on the sidewalls of portions of semiconductor substrate 20 facing recess 54. Further, if any fences, such as fences 46 as shown in FIG. 9B, formed in preceding process steps, the fences will be removed in the formation of recess 54.

Figure 13:
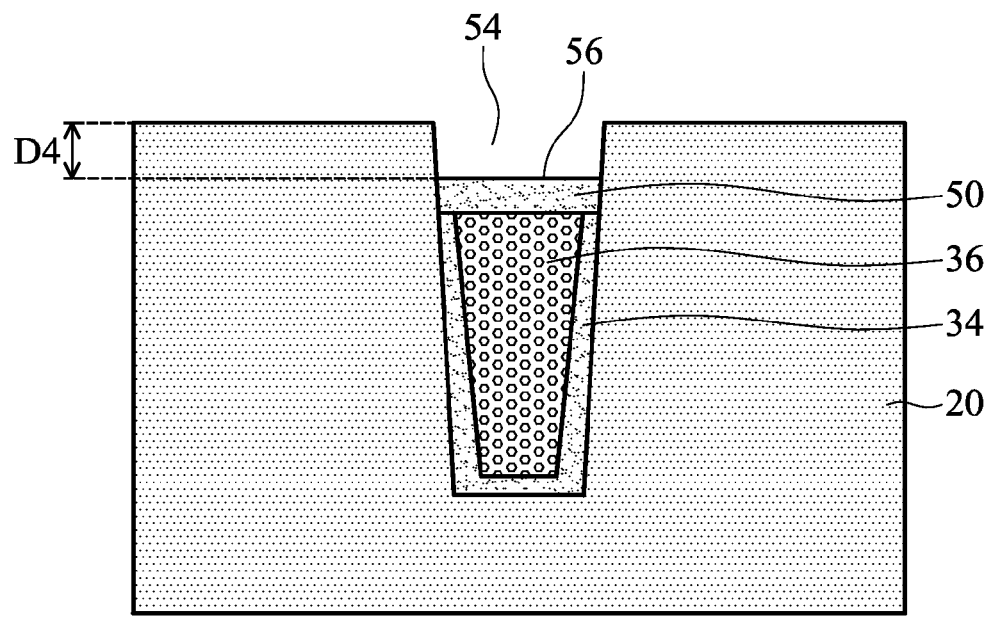

In the resulting structure as shown in FIG. 13, STI region 52 includes two regions, oxide 36 and oxide 50. Oxide 36 and oxide 50 may be formed of different or same dielectric materials. Even if they are formed of substantially same materials with the same compositions, for example, silicon oxides, due to the difference in the formation processes, they may have distinguishable characteristics. For example, oxide 50 formed by HDP has a higher density than that of oxide 36 formed by HARP, and both densities are smaller than the densities of thermal oxide, for example, gate dielectric 62 (not shown in FIG. 13, refer to FIG. 14) when it is formed of thermal oxidation. The characteristic differences are also reflected by the difference in etching rates. If the etching rate of thermal silicon oxide, such as gate dielectric 62, is used as criteria, then the relative etching rate of oxide 50 as compared to the etching rate of thermal silicon oxide may be about 1.1, while the relative etching rate of oxide 36 as compared to the etching rate of thermal silicon oxide may be about 1.25.

Figure 14:
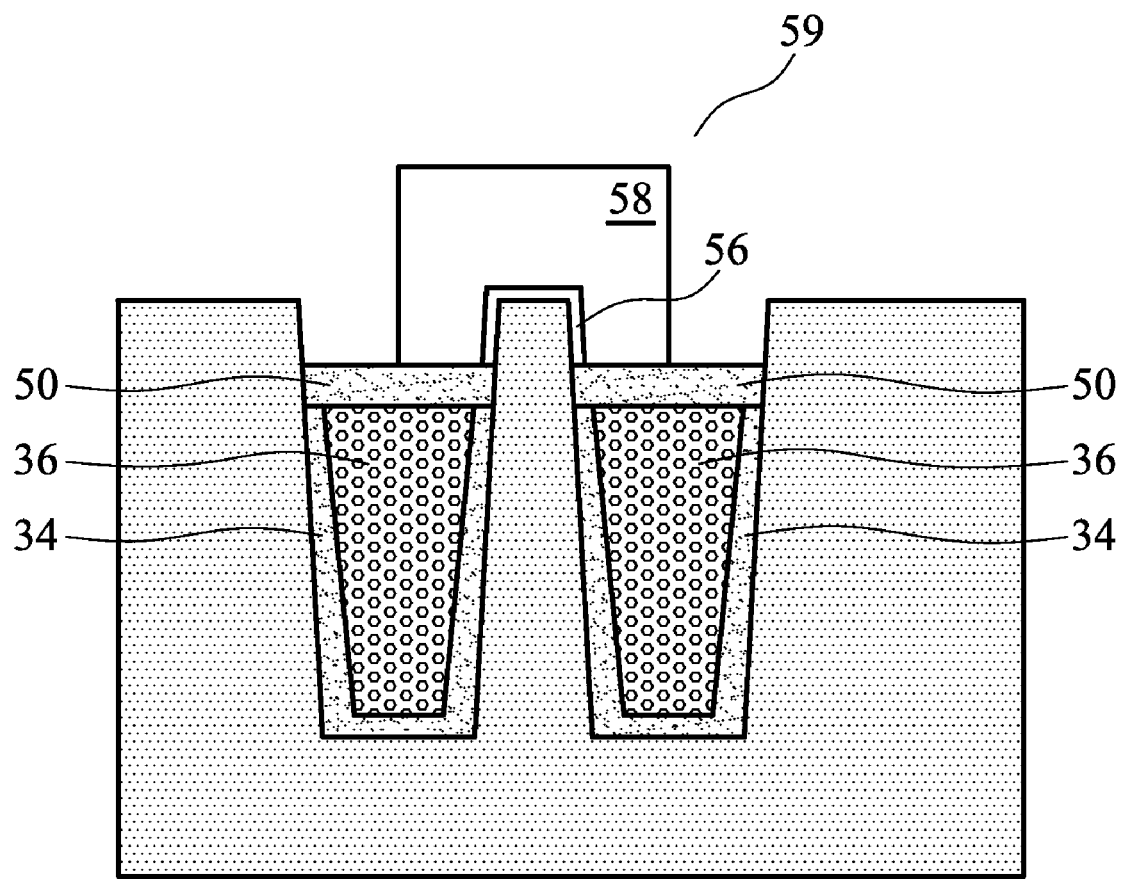

The structure shown in FIG. 13 may be used to form fins that are used for forming FinFETs. FIG. 14 illustrates an exemplary FinFET 59. Fin 60 may be formed by forming STI regions 52 surrounding a portion of substrate 20. After the recessing of STI regions 52 (also refer to FIG. 13), the portion of substrate 20 above the top surface of the recessed STI regions 52 becomes fin 60. Fin 60 has height H and width W', wherein a height-to-width ratio H/W' may be between about 1 to about 5. In an embodiment as shown in FIG. 14, gate dielectric 62 is formed to cover the top surface and sidewalls of fin 60. Gate dielectric 62 may be formed by thermal oxidation, and hence may include thermal silicon oxide. The bottom (interface) of gate dielectric 62 may contact the top surface of oxide 50. Since no fences exist on the sidewalls of fin 60, the thickness of gate dielectric 62 is uniform. The remaining components of FinFET 59, including gate electrode 64, source and drain regions, and source and drain silicides (not shown) are then formed. The formation processes of these components are known in the art, and hence are not repeated herein.

The embodiments of the present invention have several advantageous features. By separating the gap-filling process into two deposition steps, and adding a recessing step therebetween, the resulting STI regions having high aspect ratios can be formed without voids. Further, with the formation and recessing of a dense oxide, the possible fences are removed. Accordingly, the respective processes are suitable for the formation of FinFETs with low leakage currents.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of forming an integrated circuit structure, the method comprising:
   providing a semiconductor substrate comprising a top surface;
   forming an opening extending from the top surface into the semiconductor substrate;
   performing a first deposition step to fill a first dielectric material into the opening;
   recessing the first dielectric material;
   performing a second deposition step to fill a remaining portion of the opening with a second dielectric material, wherein the second dielectric material is denser than the first dielectric material;
   recessing the second dielectric material until a top surface of the second dielectric material is lower than the top surface of the semiconductor substrate, wherein after the step of recessing the second dielectric material, a portion of the semiconductor substrate adjoining the opening forms a fin;
   forming a gate dielectric over a top surface and sidewalls of the fin; and
   forming a gate electrode over the gate dielectric.

2. The method of claim 1, wherein the second deposition step is performed using a high-density plasma chemical vapor deposition (HDPCVD).

3. The method of claim 1, wherein the first deposition step is performed using a high aspect-ratio process (HARP).

4. The method of claim 1, wherein the step of recessing the first dielectric material is performed using a polymer-rich process gas.

5. The method of claim 4, wherein the polymer-rich process gas is selected from the group consisting essentially of $CHF_3$, $CH_2F_2$, $CH_3F$, $C_4F_6$, $C_4F_8$, $C_5F_8$, and combinations thereof.

6. The method of claim 1, wherein the step of recessing the first dielectric material is performed using Siconi.

7. The method of claim 1, wherein the step of recessing the first dielectric material is performed using a wet dip, and wherein the method further comprises, before the step of recessing the first dielectric material, performing a nitrogen dry anneal to the first dielectric material.

8. The method of claim 1, wherein the opening has an aspect ratio greater than about 11.

9. A method of forming an integrated circuit structure, the method comprising:
   providing a semiconductor substrate comprising a top surface;
   forming an opening extending from the top surface into the semiconductor substrate;
   performing a first deposition step using a first deposition method to fill a first dielectric material into the opening;
   recessing the first dielectric material to form a first recess in the opening and having a first depth;
   performing a second deposition step to fill the opening with a second dielectric material, wherein the second deposition step is performed using a second deposition method different from the first deposition method;
   after the second deposition step, performing an anneal on the second dielectric material; and
   after the annealing, recessing the second dielectric material to form a second recess in the opening, wherein the second recess has a second depth smaller than the first depth.

10. The method of claim 9, wherein after the step of recessing the second dielectric material, a top surface of a remaining portion of the second dielectric material is lower than the top surface of the semiconductor substrate.

11. The method of claim 9, wherein the second dielectric material has a greater density than the first dielectric material.

12. The method of claim 9, wherein the first deposition method comprises a high aspect-ratio process (HARP), and the second deposition method comprises a high-density plasma (HDP).

13. The method of claim 9, wherein the step of recessing the first dielectric material is performed using a polymer-rich process gas selected from the group consisting essentially of $CHF_3$, $CH_2F_2$, $CH_3F$, $C_4F_6$, $C_4F_8$, $C_5F_8$, and combinations thereof.

14. The method of claim 9, wherein the step of recessing the first dielectric material is performed using Siconi.

15. The method of claim 9, wherein the step of recessing the first dielectric material is performed using a wet dip, and wherein the method further comprises performing a nitrogen dry anneal after performing the first deposition step and before the step of recessing the first dielectric material.

16. A method of forming an integrated circuit structure, the method comprising:
   providing a semiconductor substrate comprising a top surface;
   forming an opening extending from the top surface into the semiconductor substrate;
   performing a first deposition step to fill a first dielectric material into the opening;
   recessing the first dielectric material to form a first recess;
   performing a second deposition step to fill the first recess with a second dielectric material using a high-density plasma (HDP);
   performing an anneal to the second dielectric material;
   performing a planarization to level the second dielectric material; and
   after the step of performing the planarization, recessing the second dielectric material.

17. The method of claim 16, wherein after the step of recessing the second dielectric material, a lower portion of the second dielectric material remains in the opening, with a top surface of the lower portion lower than the top surface of the semiconductor substrate.

18. The method of claim 16, wherein the second dielectric material has a lower etching rate than the first dielectric material.

19. An integrated circuit structure comprising:
   a semiconductor substrate comprising a top surface;
   an opening extending from the top surface into the semiconductor substrate;
   a first dielectric material filling a lower portion of the opening, wherein the first dielectric material has a first etching rate;
   a second dielectric material filling an upper portion of the opening, wherein the second dielectric material has a second etching rate lower than the first etching rate, wherein a portion of the semiconductor substrate above a top surface of the second dielectric material forms a fin comprising a first sidewall facing the opening, and a second sidewall on an opposite side of the fin than the first sidewall;
   a gate dielectric over a top surface and on the first sidewall and the second sidewall of the fin, wherein the gate dielectric has a bottom interface contacting the top surface of the second dielectric material; and
   a gate electrode over the gate dielectric.

20. The integrated circuit structure of claim 19, wherein a top surface of the second dielectric material is lower than the top surface of the semiconductor substrate.

21. The integrated circuit structure of claim 20, wherein the top surface of the second dielectric material is lower than the top surface of the semiconductor substrate by between about 10 nm and about 100 nm.

22. The integrated circuit structure of claim 19, wherein the opening has an aspect ratio of greater than about 11.0.

23. The integrated circuit structure of claim 19, wherein the first dielectric material and the second dielectric material are silicon oxide.

24. The integrated circuit structure of claim 19, wherein the first etching rate and the second etching rate are greater than an etching rate of a thermal oxide.

25. The integrated circuit structure of claim 19, wherein the first dielectric material is spaced apart from the semiconductor substrate by a liner oxide, and wherein the second dielectric material contacts the semiconductor substrate.

26. An integrated circuit structure comprising:
a semiconductor substrate comprising a top surface;
an opening extending from the top surface into the semiconductor substrate;
a liner oxide lining the opening;
a first dielectric material filling a lower portion of the opening and spaced apart from the semiconductor substrate by the liner oxide, wherein the first dielectric material has a first density;
a second dielectric material filling an upper portion of the opening, wherein the second dielectric material has a second density greater than the first density, wherein the second dielectric material contacts the semiconductor substrate, wherein a portion of the semiconductor substrate above a top surface of the second dielectric material forms a fin:
a gate dielectric over a top surface and on sidewalls of the fin; and
a gate electrode over the gate dielectric.

27. The integrated circuit structure of claim 26, wherein the second dielectric material has a substantially flat top surface.

28. The integrated circuit structure of claim 26, wherein the second dielectric material has a top surface lower than the top surface of the semiconductor substrate.

29. The integrated circuit structure of claim 26, wherein the first dielectric material is different from the second dielectric material.

30. The integrated circuit structure of claim 26, wherein the opening has an aspect ratio greater than about 11.0.

31. The integrated circuit structure of claim 26, wherein the first density and the second density are less than a density of the gate dielectric.

32. The integrated circuit structure of claim 26, wherein the fin has a height-to-width ratio between about 1 and about 5.

* * * * *